(12) United States Patent
Yu et al.

(10) Patent No.: US 8,030,781 B2
(45) Date of Patent: Oct. 4, 2011

(54) BOND PAD STRUCTURE HAVING DUMMY PLUGS AND/OR PATTERNS FORMED THEREAROUND

(75) Inventors: Chen-Hua Yu, Hsinchu (TW); Tien-I Bao, Hsinchu County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 257 days.

(21) Appl. No.: 12/233,974

(22) Filed: Sep. 19, 2008

(65) Prior Publication Data

US 2010/0072632 A1    Mar. 25, 2010

(51) Int. Cl.
*H01L 23/485* (2006.01)

(52) U.S. Cl. .......... 257/784; 257/786; 257/E23.02

(58) Field of Classification Search .......... 438/926
See application file for complete search history.

(56) References Cited

U.S. PATENT DOCUMENTS

| 7,049,701 B2 * | 5/2006 | Usui | 257/773 |
| 7,211,897 B2 * | 5/2007 | Yamanoue et al. | 257/758 |

* cited by examiner

*Primary Examiner* — Stephen W Smoot
(74) *Attorney, Agent, or Firm* — Thomas|Kayden

(57) ABSTRACT

A semiconductor structure is provided. In one embodiment, a bond pad is formed above one or more underlying layers of a substrate. A plurality of dummy plugs are spaced around the bond pad, the plurality of dummy plugs substantially vertically traversing the one or more underlying layers, wherein the plurality of dummy plugs anchor at least two of the underlying layers together to achieve improved mechanical strength.

13 Claims, 2 Drawing Sheets

BOND PAD STRUCTURE HAVING DUMMY PLUGS AND/OR PATTERNS FORMED THEREAROUND

BACKGROUND

The present invention relates generally to the fabrication of semiconductor devices, and more particularly, to a de-lamination resistant bond pad structure.

In a typical integrated circuit chip, active circuit elements such as transistors, resistors, etc., are positioned in the central portion, i.e., the active region, of the chip whilst the bond pads are normally arranged around the periphery of the active region such that active circuit elements are not likely to be damaged during a subsequent bonding process. When a wire bonding process is performed on a bond pad of a chip, the process normally entails the bonding of a gold or aluminum wire to the bond pad by fusing the two together with ultrasonic energy, for example. The wire is then pulled away from the bond pad after the bond is formed. During the bonding of the wire to the pad and the pulling away of the wire from the pad, high mechanical stress is placed on the bond pad. When the bond pads are not properly formed, defects such as de-lamination of the bond pad from underlying layers of the chip have been encountered. This occurs due to the fact that during the attachment of the wire to the bond pad, a high level of mechanical stress is placed on the bond pad. It occurs when a relatively large, heavy bond is placed on top of layers, which may not have strong adhesion to the underlying layers. For instance, one factor that may affect adhesion between the layers is the use of low dielectric constant (low-k) materials that cause adhesion problems between these low-k dielectric materials and the underlying oxide layers. The adhesion of low-k dielectric material, or inter-metal-dielectric (IMD) material to oxide is poorer than that of oxide to oxide. The use of low-k dielectric materials, such as HSQ (hydrogen silsesquioxane) and MSQ (methylsilsesquioxane) have been desirable in high performance semiconductor structures since due to their low-k characteristics, thinner layers of the materials may be utilized as insulating layers. Another drawback of these low-k dielectric materials is their low thermal conductivity when compared to that of regular oxide. During a chip bonding process, the local temperature around a bond pad is significantly higher due to the poor thermal conductivity of the low-k dielectric material. The thermal stress caused by the poor thermal conductivity of IMD, in addition to the mechanical stresses caused by the bonding operation, may cause de-lamination of the low-k IMD layers from their underlying oxide layers.

One conventional method for overcoming such increased de-lamination characteristics provides for the forming of a polysilicon pattern under a bond pad to prevent the bond pad from peeling during subsequent manufacturing processes. The use of a polysilicon interface between the metal bond pad and the interlayer dielectric prevents bond pad peeling or lifting by having chemically compatible interlayer surfaces, thereby providing attendant increased adhesive properties. However, a significant disadvantage is that the polysilicon layer is typically deposited directly over a layer of insulating material rather than over a layer of a metallic material, thereby providing adhesion and anchoring characteristics that are not optimal. Various other approaches to solving the de-lamination and poor thermal conductivity issues require additional fabrication process steps during the fabrication of the bond pads.

For these reasons and other reasons that will become apparent upon reading the following detailed description, there is a need for an improved bond pad structure that avoids the de-lamination and thermal conductivity problems associated with conventional bond pad structures.

SUMMARY

The present disclosure is directed to a semiconductor structure. In one embodiment, a bond pad is formed above one or more underlying layers of a substrate. A plurality of dummy plugs are spaced around the bond pad, the plurality of dummy plugs substantially vertically traversing the one or more underlying layers, wherein the plurality of dummy plugs anchor at least two of the underlying layers together to achieve improved mechanical strength.

BRIEF DESCRIPTION OF THE DRAWINGS

The features, aspects, and advantages of the present invention will become more fully apparent from the following detailed description, appended claims, and accompanying drawings in which:

DETAILED DESCRIPTION

In the following description, numerous specific details are set forth to provide a thorough understanding of the present invention. However, one having an ordinary skill in the art will recognize that the invention can be practiced without these specific details. In some instances, well-known structures and processes have not been described in detail to avoid unnecessarily obscuring the present invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Figure 1:
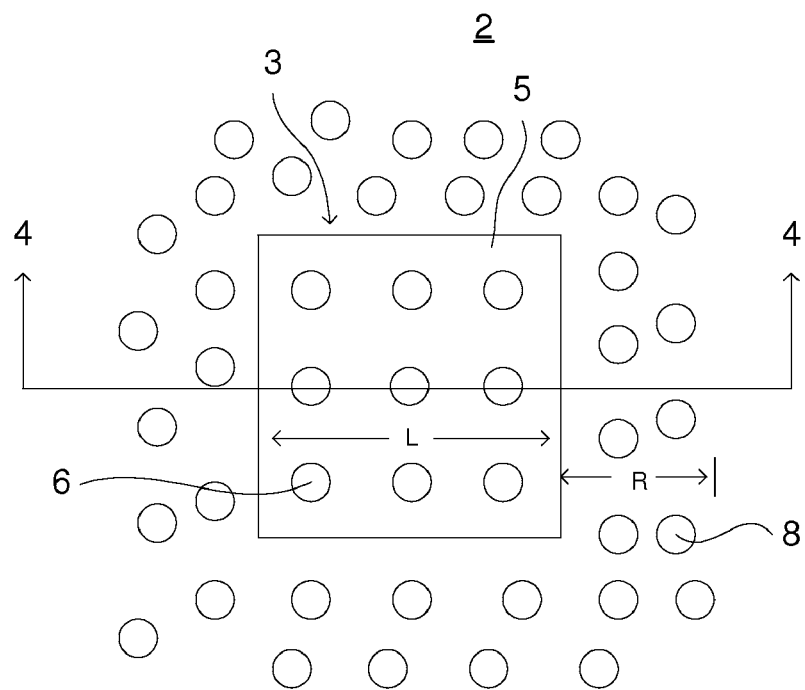
FIG. 1 is a plan view of a part of a semiconductor wafer showing a bond pad and dummy vias according to one embodiment of the present invention.
Figure 4:
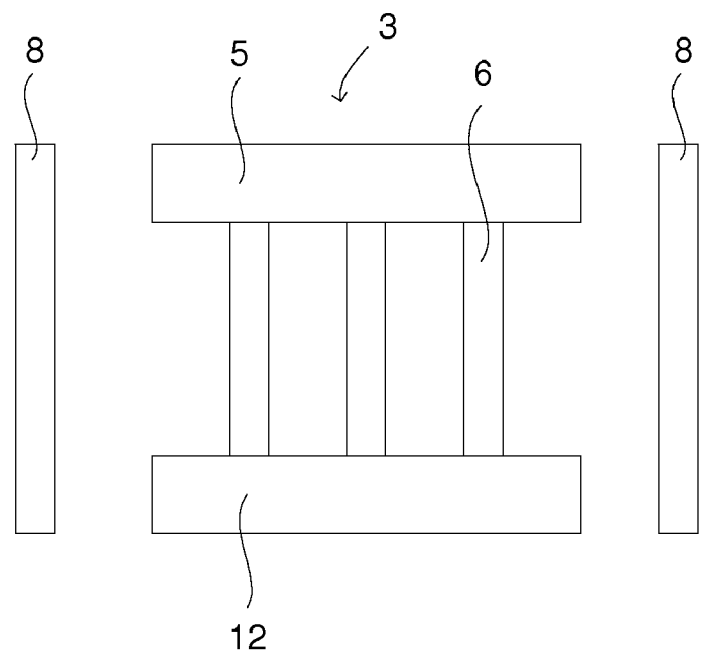
FIG. 4 is a cross-sectional view of FIG. 1.

FIG. 1 is a plan view of a part of a semiconductor wafer 2 showing a bond pad 3 formed in a top surface of the wafer. The number of bond pads can vary, but there is at least one bond pad formed in the top surface, typically the final IMD layer. Bond pad 3 is formed by an upper metal pad 5 and a lower metal pad 12 connected therebetween by a plurality of metal via plugs 6. A cross-sectional view of FIG. 1 is shown in FIG. 4. According to an aspect of the present disclosure, in order to prevent bond pad 3 from peeling during processing, such as a wire bonding process a plurality of dummy via plugs 8 is provided spaced around the bond pad 3. The plurality of dummy via plugs 8 traverse substantially vertically one or more underlying layers of bond pad 3, wherein the plurality of dummy via plugs 8 anchor at least two of the underlying layers together to achieve improved mechanical strength. The underlying layers may be dielectric material layers, such as low dielectric constant (k) material layers and may be, for example, IMD material layers. The dummy via plugs 8 may go through these various underlying dielectric material layers and down into the substrate. By anchoring the underlying layers together, the plurality of dummy via plugs 8 provide improved binding between the one or more underlying layers as well as improved distribution of physical stress on the bond pad 3.

The dummy via plugs 8 can be formed simultaneously with the manufacture of other circuit elements of the IC and without the need for special or extra manufacturing processes, or at most a minimum number of additional steps. First, contact holes may be formed in the underlying dielectric material layers. The contact holes may then be filled with a metal, such as tungsten, preferably using a chemical vapor deposition (CVD) process, and thereafter polished or etched back by a conventional chemical or mechanical process thereby forming dummy via plugs 8. Dummy via plugs 8 may be made of various thermally conductive materials capable of transferring excessive heat generated during a wire bonding process around the bond pads and distributing it to other layers of the semiconductor wafer, such as a lower metallization layer. In one embodiment, dummy via plugs are made from tungsten, aluminum, refractory metal, copper, gold, TaN, titanium, TiN, and nickel.

The length, width, size, shape, aspect ratio, and depth of each individual dummy via plugs 8 and the number of dummy via plugs 8 placed around the bond pad 3 may all be independently adjusted to provide the heat transfer requirements and/ or the desired anchoring effects that will prevent bond pad 3 from peeling or de-lamination during subsequent manufacturing process steps. Moreover, the selection of each of these particular parameters is dependent upon design selection regarding the materials and complexity of the construction versus the advantages obtained. Such advantages may relate to the reliability of the structure or some other electronic or mechanical performance characteristics, such as current-carrying capability or mechanical flexibility.

In one embodiment, each of the plurality of dummy via plugs 8 may comprise non-uniform width, aspect ratio, or length. The dummy via plugs 8 may have uniform or non-uniform spacing relative to each other. In another embodiment, each of the plurality of dummy via plugs 8 has non-uniform spacing relative to each other.

The plurality of dummy via plugs 8 is provided spaced around the bond pad 3. In another embodiment, the dummy via plugs 8 substantially surrounds bond pad 3. The length, width, size, shape, aspect ratio, and depth of each individual dummy via plugs 8 as well as the number of dummy via plugs 8 may also be adjusted according to the size of the bond pad. In general, a smaller bond pad covering less area on the top surface of a wafer may require a larger number of surrounding dummy via plugs to anchor the bond pad to the underlying layers thereby preventing bond pad de-lamination as compared to a larger bond pad.

Figure 2:
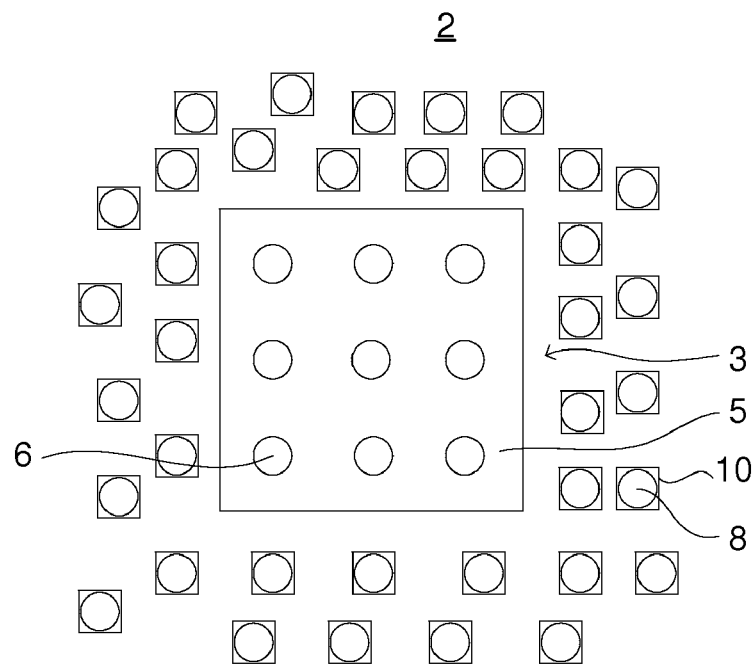
FIG. 2 is a plan view of a part of a semiconductor wafer showing a bond pad and dummy vias and patterns according to another embodiment of the present invention.
Figure 3:
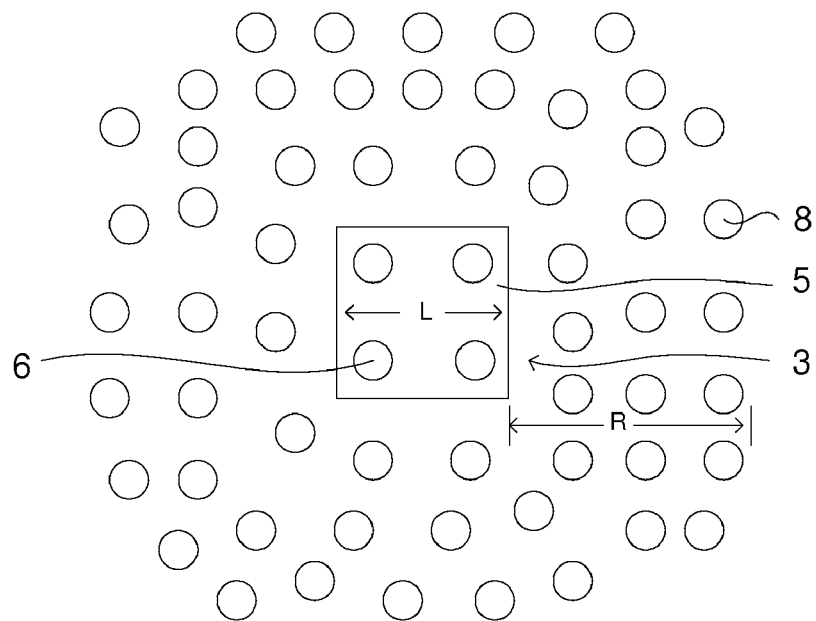
FIG. 3 is a plan view of a part of a semiconductor wafer showing a bond pad and dummy vias according to yet another embodiment of the present invention.

Through experimental data, it was found that the maximum surrounding range (R) of the plurality of dummy via plugs relative to the bond pad is given by the following formula:

$$R = C/L,$$

where L is the maximum side length of the bond pad, and C=4900, a constant.
As an example, given a bond pad with a length (L) of 70 µm, the maximum surrounding Range (R) is 70 µm. As a further example, for a smaller bond pad with a length (L) of 40 µm, the maximum surrounding Range (R) is 122.5 µm. FIG. 3 shows a bond pad having a small maximum side length (L) compared to the larger maximum side length (L) of the bond pad in FIG. 1. However, the maximum surrounding range (R) of the dummy via plugs in FIG. 2 is greater than the maximum surrounding range (R) of the dummy via plugs in FIG. 1.

Continuing with FIG. 1, dummy patterns may also be formed above one or more of the plurality of dummy via plugs 8 according to one embodiment of the present disclosure. FIG. 2 shows dummy patterns 10 formed on each of the plurality of dummy via plugs 8. Dummy patterns may be formed according to conventional deposition and patterning techniques. The dummy pattern preferably comprises in plan view a square shape or rectangle shape, although other shapes are suitable. In one embodiment, a plurality of isolated (i.e., not attached to via plugs) dummy patterns 10 is formed adjacent to a plurality of dummy via plugs 8.

The present disclosure provides a bond pad structure that avoids bond pad peeling or de-lamination during subsequent manufacturing process steps, such as a wirebonding process. By providing a plurality of dummy via plugs around the bond pad and anchoring them into one or more underlying layers of the bond pad, the bond pad structure is mechanically enhanced, stresses introduced during a wire bonding process is alleviated, thermal stresses is channeled away from the bond pad area, and bond pad de-lamination is avoided. Thus, using the embodiments of the present disclosure, it is possible to form a robust bond pad structure, simplify the manufacturing process, and reduce the manufacturing cost.

In the preceding detailed description, the present invention is described with reference to specifically exemplary embodiments thereof. It will, however, be evident that various modifications, structures, processes, and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A semiconductor structure, comprising:
   a bond pad formed above one or more underlying layers of a substrate; and
   a plurality of dummy plugs spaced around the bond pad, the plurality of dummy plugs substantially vertically traversing the one or more underlying layers, wherein the plurality of dummy plugs anchor at least two of the underlying layers together to achieve improved mechanical strength, and wherein each of dummy plugs comprises non-uniform width, and wherein a maximum surrounding range of the plurality of dummy plugs relative to the bond pad is given by the formula, R=C/L, where L is the maximum side length of the bond pad, and C=4900, a constant in units of square µm.

2. The structure of claim 1, wherein the structure provides improved binding between the one or more underlying layers as well as improved distribution of physical stress on the bond pad.

3. The structure of claim 1, wherein each of the plurality of dummy plugs has non-uniform spacing relative to each other.

4. The structure of claim 1, further comprising dummy patterns formed above one or more of the plurality of dummy plugs.

5. The structure of claim 1, wherein each of the plurality of dummy plugs is electrically conductive.

6. The structure of claim 1, wherein each of the plurality of dummy plugs is made of metal.

7. The structure of claim 6, wherein the metal is selected from the group consisting of tungsten, aluminum, refractory metal, copper, gold, TaN, titanium, TiN, and nickel.

8. The structure of claim 1, wherein the one or more underlying layers are dielectric material layers.

9. The structure of claim 8, wherein the dielectric material layer is formed of a low dielectric constant (k) material.

10. A semiconductor structure, comprising:
    a bond pad formed above one or more underlying layers of a substrate; and
    a plurality of dummy plugs substantially surrounding the bond pad, the plurality of dummy plugs substantially vertically traversing the one or more underlying layers, wherein the plurality of dummy plugs anchor at least two of the underlying layers together to achieve improved mechanical strength, and wherein each of dummy plugs comprises non-uniform width, and wherein a maximum surrounding range of the plurality of dummy plugs relative to the bond pad is given by the formula, $R=C/L$,
    where L is the maximum side length of the bond pad, and $C=4900$, a constant in units of square μm.

11. The structure of claim 10, wherein the one or more underlying layers are dielectric material layers.

12. A bond pad structure comprising:
    a bond pad formed above one or more underlying layers of a substrate; and
    a plurality of dummy plugs proximal to and spaced apart from the bond pad, the plurality of dummy plugs substantially vertically traversing the one or more underlying layers, wherein the plurality of dummy plugs anchor at least two of the underlying layers together to achieve improved mechanical strength, and wherein each of dummy plugs comprises non-uniform width, and wherein a maximum surrounding range of the plurality of dummy plugs relative to the bond pad is given by the formula, $R=C/L$,
    where L is the maximum side length of the bond pad, and $C=4900$, a constant in units of square μm.

13. The structure of claim 12, wherein the one or more underlying layers are layer is a dielectric material layer layers.

* * * * *